United States Patent
Chaudhari

(10) Patent No.: US 10,056,511 B2
(45) Date of Patent: Aug. 21, 2018

(54) AMORPHOUS SILICON/CRYSTALLINE SILICON THIN-FILM TANDEM SOLAR CELL

(71) Applicant: Ashok Chaudhari, Briarcliff Manor, NY (US)

(72) Inventor: Ashok Chaudhari, Briarcliff Manor, NY (US)

(73) Assignee: Solar-Tectic LLC, Briarcliff Manor, NY (US)

( * ) Notice: Subject to any disclaimer, the term of this patent is extended or adjusted under 35 U.S.C. 154(b) by 0 days.

(21) Appl. No.: 15/266,720

(22) Filed: Sep. 15, 2016

(65) Prior Publication Data

US 2017/0005209 A1    Jan. 5, 2017

Related U.S. Application Data

(60) Provisional application No. 62/374,951, filed on Aug. 15, 2016.

(51) Int. Cl.
| H01L 31/0236 | (2006.01) |
| H01L 31/0288 | (2006.01) |
| H01L 31/032 | (2006.01) |
| H01L 31/0376 | (2006.01) |
| H01L 31/0392 | (2006.01) |
| H01L 31/072 | (2012.01) |
| H01L 31/0745 | (2012.01) |
| H01L 31/0747 | (2012.01) |
| H01L 31/18 | (2006.01) |

(52) U.S. Cl.
CPC .... *H01L 31/02366* (2013.01); *H01L 31/0288* (2013.01); *H01L 31/032* (2013.01); *H01L 31/0392* (2013.01); *H01L 31/03767* (2013.01); *H01L 31/03921* (2013.01); *H01L 31/072* (2013.01); *H01L 31/0745* (2013.01); *H01L 31/0747* (2013.01); *H01L 31/1804* (2013.01); *Y02E 10/547* (2013.01)

(58) Field of Classification Search
CPC ............................................. H01L 31/02366
See application file for complete search history.

(56) References Cited

U.S. PATENT DOCUMENTS

| 5,897,331 A * | 4/1999 | Sopori ............... H01L 21/2026 136/258 |
| 9,054,249 B2 | 6/2015 | Chaudhari |
| 2010/0237272 A1* | 9/2010 | Chaudhari .......... C03C 17/3618 252/62.55 |

OTHER PUBLICATIONS

Li et al. "Ultra-thin,high performance crystalline silicon tandem cells fabricated on a glass substrate" Solar Energy Materials & Solar Cells, 2015, pp. 225-231, vol. 141, Elsevier, USA.

(Continued)

*Primary Examiner* — Marvin Payen
(74) *Attorney, Agent, or Firm* — Danielle C. Sullivan; Carter Ledyard & Milburn LLP

(57) ABSTRACT

A device and method of making an amorphous-silicon/inorganic thin film tandem solar cell including the steps of depositing a textured oxide buffer layer on an amorphous substrate, depositing a crystalline inorganic semiconductor film from a eutectic alloy on the buffer layer, and depositing an amorphous film on the crystalline inorganic film, the amorphous film forming a p-n junction with the crystalline inorganic semiconductor for a solar cell device.

13 Claims, 1 Drawing Sheet

(56) References Cited

OTHER PUBLICATIONS

Hoetzel, J.E. et al. "Microcrystalline Bottom Cells in Large Area Thin Film Silicon Micromorph™ Solar Modules" Solar Energy Materials & Solar Cells, 2016, pp. 178-189, vol. 157, Elsevier, USA.

Schropp, R. "Amorphous and Microcrystalline Silicon Solar Cells", Solar Cell Materials:Deveopling Technologies, First Ed. 2014, pp. 1-4, John Wiley & Sons, Ltd. UK.

Speakman, Scott. "Introduction to High Resolution X-Ray Diffraction of Epitaxial Thin Films", 2012, http://prism.mit.edu/xray, pp. 1-53, MIT Center for Materials Science and Engineering, USA.

Schiff, E. et al. "Amorphous Silicon-Based Solar Cells", 2011, Handbook of Photovoltaic Science and Engineering, Second Ed. 2011, pp. 1-3, John Wiley & Sons, Ltd. UK.

\* cited by examiner

AMORPHOUS SILICON/CRYSTALLINE SILICON THIN-FILM TANDEM SOLAR CELL

This application claims priority to U.S. Provisional Patent Application No. 62/374,951 filed Aug. 15, 2016 entitled "AMORPHOUS SILICON/CRYSTALLINE SILICON THIN-FILM TANDEM SOLAR CELL" and is hereby incorporated by reference in its entirety.

The present invention relates to amorphous silicon thin-film tandem solar cells, transistors, and other electronic devices.

BACKGROUND OF THE INVENTION

Among the available thin-film technologies, silicon thin-film technology has potential as the technology allows for the manufacturing of tandem and triple junction cells which can provide the high efficiency needed in today's solar cell market.

Amorphous silicon (a-Si:H) has been combined with silicon wafers for heterojunction tandem solar cells with success. For example, Panasonic sells solar panels called "HIT," which stands for Heterojunction with Intrinsic Thin layer. This silicon heterojunction technology involves hydrogenated a-Si (or a-Si:H) combined with silicon wafers and is being explored by various companies and research groups. Such solar cells are also referred to as "Si-HJT" or "silicon heterojunction technology" cells. Sanyo has made solar cells from this technology with 23% efficiency.

The a-Si:H/c-Si heterojunction technology ("HJT"), combines the advantages of crystalline silicon wafer solar cells with the excellent absorption and passivation characteristics of amorphous silicon.

To produce the electric structures of heterojunction cells, it is necessary to apply thin layers of doped and intrinsic amorphous silicon on both sides of n-type silicon wafers as well as transparent conductive oxide layers (TCO) to absorb the generated power.

As a result of the high light yield and outstanding passivation characteristics of amorphous silicon, it is possible to reach efficiency rates of more than 22%. Moreover, a-Si:H/c-Si heterojunction cells show a considerably lower temperature coefficient than conventional silicon wafer (c-Si) solar cells.

Heterojunction, a-Si:H/c-Si technology, can only be realized on n-type monocrystalline material and the maximum efficiency rate lies currently at about 21%.

Heterojunction solar cells have also been made combining a-Si:H with microcrystalline silicon (μc-Si:H) thin films with success. This is a second type of a-Si tandem cell technology on the market today. While this is called microcrystalline (or sometimes nanocrystalline) silicon, it is actually still—perhaps misleadingly—amorphous (with very small crystals) and should not be confused with crystalline thin-film silicon (CSiTF)—which is polycrystalline or textured. For example, the best module efficiency in a microcrystalline silicon solar cell is achieved when the Raman crystallinity of the intrinsic microcrystalline layer is between 45% and 60% or nearby the so called "transition phase" with an a-Si:H and μc-Si:H mixed phase material (J. E. Hoetzel et al "Microcrystalline bottom cells in large area thin film silicon MICROMORPH™ solar modules", May, 2016). The Raman crystallinity of CSiTF on the other hand should be as close to 100% (greater than 90%) as possible and ideally of pure, single phase (not in transition).

A-Si:H/μc-Si:H thin-film silicon tandem cells have been investigated by many groups. One company, Tel Solar AG, termed their cell "Micromorph™" which is a combination of the words MICROcrystalline and aMORPHous. So far the world record for a-Si:H/μc-Si:H or Micromorph™ cells is 12.34% (J. E. Hoetzel et al "Microcrystalline bottom cells in large area thin film silicon MICROMORPH™ solar modules", May, 2016). A-Si/μc-Si thin-film silicon "hybrid" tandem cells are currently for sale by Kaneka Solar Corporation (their efficiencies are around 10%).

As stated above, both a-Si:H/c-Si and a-Si:H/μc-Si:H (or Micromorph) technologies are actually used in the current market place and panels made from these technologies can be purchased. However, despite the success of these technologies, efficiencies are still limited and need to surpass 25% efficiency to become truly competitive with the current state of the art crystalline silicon panels and those which are rapidly emerging. What is needed therefore is an a-Si tandem architecture that enables much higher efficiency. The present invention meets this need by replacing the silicon wafer (c-Si) or microcrystalline silicon (μc-Si) under layers with CSiTF.

SUMMARY OF THE INVENTION

The present invention provides a method of making an amorphous-silicon/inorganic thin film tandem solar cell including the following steps: depositing a textured oxide buffer layer on an amorphous substrate, depositing a crystalline inorganic semiconductor film from a eutectic alloy on said buffer layer, and depositing an amorphous film on said crystalline inorganic film, said amorphous film forming a p-n junction with said crystalline inorganic semiconductor for a solar cell device.

The present invention also provides a solar cell device including: a textured oxide buffer layer on an amorphous substrate, a textured crystalline inorganic film on said textured buffer layer, and an amorphous film layer on said textured crystalline inorganic film.

Currently, no tandem device involving a-Si (with or without H) and crystalline silicon thin-film (CSiTF) have been reported on in the literature to date. CSiTF is polycrystalline and textured which means that much higher efficiencies are achievable than with μc-Si:H. The efficiency of CSiTF in the present invention is close to or the same as monocrystalline Si. Moreover, CSiTF has the potential to replace silicon wafers which dominate the market (90% of all solar PV modules produced worldwide are based on crystalline silicon wafers). This is because CSiTF uses much less Si material, and can be fabricated at much lower temperatures. There is therefore the potential for tremendous cost savings. Moreover, a-Si also has an ideal bandgap for a tandem layer with CSiTF. The 1.7eV a-Si bandgap on the 1.12eV CSiTF bandgap is known in the art to be ideal and allows for a 45% efficiency potential.

There is a need for an a-Si/CSiTF tandem solar cell device which can be made in a simple and cost effective manner. The present invention meets this need.

An object of the present invention is to provide a simple, cost-effective method of making an amorphous silicon (a-Si)/ crystalline silicon thin-film (CSiTF) solar cell that is highly efficient.

Another object of the present invention is to provide a method of making an a-Si tandem or hybrid solar cell with improved electronic properties, such as enhanced medium range order (MRO) or long range order.

Another object of the present invention is to provide a method of making an a-Si/CSiTF solar cell without the addition of hydrogen for passivation.

Another object of the present invention is to provide a method of making an a-Si/CSiTF solar cell without light-induced degradation.

Another object of the present invention is to provide a method of lowering the defect density in the a-Si film.

Another object of the present invention is to provide a method of making an a-Si/CSiTF tandem solar cell with a textured [111] crystal orientation on the underlying layer surface.

Another object of the present invention is to provide a method of making an un-hydrogenated a-Si that allows for doping.

Another object of the present invention is to provide a method of making an a-Si solar cell that is not p-i-n.

BRIEF DESCRIPTION OF THE DRAWINGS

A more detailed understanding of the invention may be had from the following description of a preferred embodiment, given by way of example and to be understood in conjunction with the accompanying drawing.

DETAILED DESCRIPTION

Figure 1:
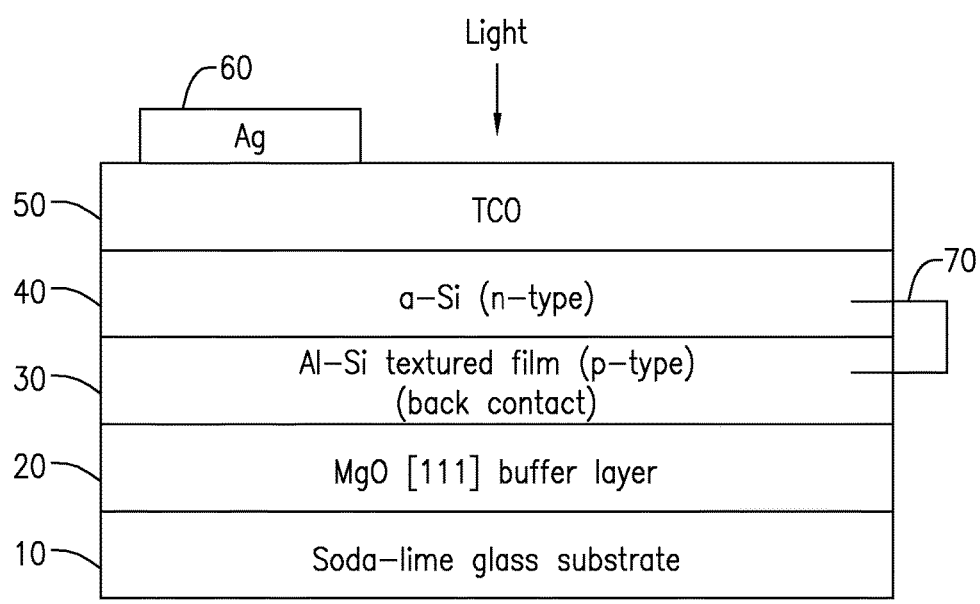
FIG. 1 shows an exemplary device architecture of the present invention.

In the present invention, the terms "heteroepitaxy", 'textured' or "oriented" and 'large grain' are defined by the following definitions. "Heteroepitaxy" is a common modern definition for epitaxy which in turn means "a single crystal layer that grows with a particular orientation determined by the single crystal substrate". This definition does not require the film and substrate to be lattice matched, but they must still be similar enough to interact and have a defined relationship. The liberal definition of epitaxy is "any film which resembles a single crystal in its lattice structure and properties". This definition lessens the importance of the relationship between the film and substrate. (See Speakman, MIT).

The terms "textured" or "oriented" mean that the crystals in the film have preferential orientation either out-of-plane or in-plane or both. For example, in the present invention the films are highly oriented out-of-plane, along the c-axis.

Finally, "large grain" is defined as a grain size larger than would have been achieved if a silicon (or other inorganic material) had been deposited under the same conditions but without metals, i.e. Cu. Furthermore, 'large grain' means the grain size is comparable to or larger than the carrier diffusion length such that electron-hole recombination at grain boundaries is negligible. In semiconductor films this means that the grain size is greater than or equal to the film thickness.

The present invention provides a method depositing an a-Si film on a CSiTF thin film which has texture (or preferential crystal orientation) on an inexpensive substrate. Even if the a-Si is deposited at very low temperature, the texture of the underlying film will improve the electrical properties of the a-Si without affecting the high bandgap, thereby improving efficiency (PCE). If the bandgap is decreased it is only very slightly. The a-Si can be deposited directly on the CSiTF or on a thin-film of an electron selecting layer (ESL), transparent conducting oxide (TCO), recombination layer, or passivation layer, all of which also have texture. Instead of CSiTF, other inorganic materials besides Si could be used as the underlying layer. For example, germanium (Ge) has a low bandgap of 0.6 eV and is another good candidate for a bottom layer in the a-Si:H/c-Ge cell.

In the present invention there is no heteroepitaxy since the top layer is not fully crystalline. It is amorphous, protocrystalline or nanocrystalline. However, the underlying textured film does have a positive effect on the overlying a-Si:H layer. In fact, even if the film is not bi-axially textured, where there is orientation both in the plane of the film and out of the plane, the c-axis oriented, aligned, grains in the film induce atomic and molecular alignment in the a-Si film. This includes any small crystals mixed with the amorphous film, thereby enhancing medium range order (MRO) to the degree that there is no need for hydrogenation of a-Si and there is improved efficiency.

Hydrogenation is typically used to passivate the a-Si. That means that the hydrogen bonds to the dangling bonds and can reduce the dangling bond density by several orders of magnitude. Hydrogenated amorphous silicon (a-Si:H) has a sufficiently low amount of defects to be used within devices such as solar photovoltaic cells, particularly in the proto-crystalline growth regime. However, hydrogenation is associated with light-induced degradation of the material, termed the Staebler—Wronski effect. In the present invention this degradation is avoided since there is no need for hydrogenation. As already stated, the textured underlying layer induces and thereby enhances what is called "medium range order" (MRO) or even "long range order" in the a-Si material, which otherwise would have short range order only. This is not to say that the a-Si film becomes microcrystalline or polycrystalline. It only means that the range of order of the atoms is increased and a relatively well-ordered crystal lattice may be formed. It should be noted that without a high deposition temperature and/or the addition of a metal to lower the crystallization temperature (as in eutectics) of the a-Si, any crystallization will be limited. If the film is no longer a-Si as a result of the textured underlying layer, then it is proto-crystalline or nanocrystalline. (So long as it is not microcrystalline there is no heteroepitaxy with the underlying layer.)

Un-hydrogenated a-Si is known to have a very high defect density which leads to undesirable semiconductor properties such as poor photoconductivity and prevents doping which is critical to engineering semiconductor properties. The textured underlying layer in the present invention lowers this defect density of the a-Si layer and allows for doping. The latter advantage is very important when it comes to device manufacturing because it means that it is possible to have only one doped a-Si layer in a device, and not a p-i-n structure.

FIG. 1 illustrates one example of a device architecture for the present invention. This illustrated device is made as follows: soda-lime glass substrate 10 is coated with a thin textured MgO [111] film 20 between 3-7 microns thick. This serves as a buffer layer to prevent impurities from soda-lime glass substrate 10 contaminating the silicon film, and to induce texture in the silicon film. A silicon (Si) thin-film between 10-30 microns is deposited on MgO buffer layer 20 from an Al-Si eutectic melt 30. The Al in the Si film serves as a p-type dopant and therefore an effective back contact in the solar cell. The Al is etched from the surface of the Si, after having segregated on top of the Si. A thin a-Si film 40 between 50 nm-10 microns is then deposited on the textured crystalline silicon thin-film and doped with phosphorous for n-type properties. P-N junction 70 has now been formed by the two layers due to the p and n-type electrical properties of the films. A transparent conducting oxide (TCO) 50, for example indium tin oxide (ITO), is deposited on a-Si 40 and serves as an electron transport layer (ETL) for effective transport of electrons to the top contact for enhanced power output. Finally, a top contact electrode 60 made of Ag is formed to complete the device. Light can enter through either side of the device since the glass 10 and MgO 20 are transparent, but enters preferably from the top (side with Ag contact 60).

As stated, a-Si:H/c-Si tandem solar cells have been made and even commercialized, and so have a-Si:H/ thin-film tandem solar cells. It should be noted that the present invention differs sharply from these technologies in several important ways. Regarding a-Si:H/c-Si: (1) the present invention avoids the need for hydrogenation (2)the present invention uses [111] oriented silicon, not [100] which is the orientation often used in c-Si wafers. There are distinct advantages to using [111] Si. It has been shown, for example , that a higher aspect ratio of lateral versus vertical growth rate can be achieved using [111] oriented Si seed layer and this may lead to continuous layers. And (3) in the present invention, the a-Si material on top serves as true high bandgap absorber material contributing to the overall efficiency (PCE) of the device. The bandgap of the a-Si is at least 1.7 eV, while the bandgap of the underlying Si material is 1.1 eV. This bandgap combination is ideal in tandem cell device fabrication.

Regarding a-Si:H/µc-Si:H thin-film silicon tandems, the present invention differs sharply from the existing technology in a number of ways, including: (1) The present invention avoids the need for hydrogenation; and (2) The CSiTF material on the bottom of the cell disclosed in the present invention is highly crystalline with large, oriented grains, and therefore has superior electronic properties to that of the µc-Si:H thin-film material on the bottom of the Micromorph™ cell, which has a transition phase-like microcrystalline bottom layer.

EXAMPLE 1

Following the patented process by P. Chaudhari (U.S. Pat. No. 9,054,249 B2), a good high vacuum system with two electron beam guns is used to deposit a eutectic alloy metal and silicon (Si) independently. Here aluminum (Al) is chosen. A soda-lime glass substrate coated with textured MgO [111] is held at temperatures between 575 and 600° C. These are nominal temperatures. It is understood to one skilled in the art that lower or higher temperatures can also be used depending upon the softening temperature of the glass substrate or the reaction kinetics of either Al or Si with the MgO layers when used as substrates. A thin Al film of approximately 10 nm thickness is deposited first. This is followed by a 100 nm thick silicon film deposited at a rate of 2 nm per minute on top of the Al. The two phase region comprising of solid silicon and a liquid Si-Al mixture is reached. The deposition is stopped and the sample is slowly cooled to room temperature. Al diffuses through the silicon film, driven by its lower surface energy relative to silicon. The silicon film is heteroepitaxially aligned with the MgO [111] film surface. The Al film on the surface can be etched chemically by well-known processes to leave behind a silicon film. Or the Al can be left behind since it is known that Al doped Si is p-type and can be used as the p in the necessary p-n junction. The Al on the surface of the Si film can also be oxidized, by simply introducing $O_2$ to the Al, in which case the Al forms $Al_2O_3$. $Al_2O_3$ is an excellent passivation layer and perhaps more importantly it can serve as a semi reflective dialectric layer which permits current matching of the two layers without increasing the thickness of the top layer. The $Al_2O_3$ layer is very thin (<10 nm) and has texture from the underlying textured Si film. The a-Si can now be deposited on either the $Al_2O_3$ film or on the Si (doped with Al) or on the Si etched film. The deposition temperature can be as low as 140° C. and 250° C. While no addition of hydrogen to the a-Si is necessary in this invention, it may be added if desirable. The a-Si film (less than 200 nm) is deposited using any one of various standard deposition techniques known in the art. It can be doped with phosphorous to become n-type since the underlying layer is p-type. (This overcomes any issues with boron-oxygen defects since there appears to be no corresponding problems with phosphorous-oxygen defects.) An example of a deposition method that may be used, includes PECVD (plasma enhanced chemical vapor deposition). The low temperature of 140° C.-250° C. for a-Si deposition, combined with the low temperature deposition possibilities of the underlying layer made from the eutectic, means that a variety of low cost materials such as glass, plastic, metal tapes, etc., can be used as a substrate. Another deposition method that may be used includes HWCVD (hot wire chemical vapor deposition). For the Al-Si deposition we have used two electron beam guns as an illustrative example. It is understood to one skilled in the art that other methods such as a single gun with multiple hearths, chemical vapor deposition, thermal heating, or sputtering, for example, can also be used.

EXAMPLE 2

Following the patented process by P. Chaudhari (U.S. Pat. No. 9,054,249 B2), a good high vacuum system with two electron beam guns is used to deposit a eutectic alloy metal and silicon (Si) independently. Here tin (Sn) is chosen. A soda-lime glass substrate coated with textured MgO [111] is held at temperatures between 575 and 600° C. (well above the eutectic temperature of Si-Sn which is 232° C.). These are nominal temperatures. It is understood to one skilled in the art that lower or higher temperatures can also be used depending upon the softening temperature of the glass substrate or the reaction kinetics of either Sn or Si with the MgO layers when used as substrates. A thin Al film of approximately 10 nm thickness is deposited first. This is followed by a 100 nm thick silicon film deposited at a rate of 2 nm per minute on top of the Sn. The two phase region comprising of solid silicon and a liquid Si-Sn mixture is reached. The deposition is stopped and the sample is slowly cooled to room temperature. Sn diffuses through the silicon film (it is insoluble with Si), driven by its lower surface energy relative to silicon. The silicon film is heteroepitaxially aligned with the MgO [111] film surface. The Sn film on the surface can be etched chemically by well-known processes to leave behind a silicon film. Or the Sn can be left behind and oxidized, by simply introducing $O_2$, in which case the Sn forms $SnO_2$. $SnO_2$ is an excellent electron transport layer (ETL) or selection layer (ESL). The $SnO_2$ layer may have texture from the textured Si film. The a-Si can now be deposited on either the $SnO_2$ film or on the Si or on the Sn etched film. The deposition temperature can be as low as 140° C. and 250° C. While no addition of hydrogen to the a-Si is necessary in this invention, it may be added if desirable. The a-Si film (less than 200 nm) is deposited using any one of various standard deposition techniques known in the art. It can be doped by phosphorous to become n-type since the underlying layer is p-type. This overcomes the issues with boron-oxygen defects since there are no corresponding problems with phosphorous-oxygen defects. An example of a deposition method that may be used includes PECVD (plasma enhanced chemical vapor deposition). The low temperature of 140° C.-250° C. for deposition, combined with the low temperature deposition possibilities of the underlying layer made from the eutectic, means that a variety of low cost materials such as glass, plastic, metal tapes, etc., can be used as a substrate. Another example of a deposition method that may be used is HWCVD (hot wire chemical vapor deposition). For the Si-Sn deposition we have used two electron beam guns as an illustrative example. It is understood to one skilled in the art that other methods such as a single gun with multiple hearths, chemical vapor deposition, thermal heating, or sputtering, for example, can also be used.

While the principles of the invention have been described in connection with specific embodiments, it should be understood clearly that the descriptions, along with the examples, are made by way of example and are not intended to limit the scope of this invention in any manner. For example, a variety of suitable substrates different from the examples given above can be utilized or a different variety of deposition methods and conditions can be employed as would be understood from this invention by one skilled in the art upon reading this document.

What is claimed is:

1. A method of making an amorphous-silicon/inorganic thin film semiconductor device comprising the steps of:
   depositing a textured oxide buffer layer on an amorphous substrate,
   depositing a textured crystalline inorganic semiconductor thin film from a eutectic alloy on said buffer layer, said crystalline inorganic semiconductor film being a bottom layer; and
   depositing an unhydrogenated amorphous semiconductor film directly on said crystalline inorganic semiconductor film, wherein said texture of said bottom layer induces alignment in said amorphous semiconductor film, reducing a defect density of said amorphous film, forming a p-n junction with said crystalline inorganic semiconductor for a semiconductor device.

2. The method of claim 1, wherein said amorphous film on said crystalline inorganic film is defect free.

3. The method of claim 1, wherein said amorphous film on said crystalline inorganic film has a low density of defects.

4. The method of claim 1, wherein said amorphous film on said crystalline inorganic film has an enhanced medium range order (MRO).

5. The method of claim 1, wherein said amorphous film on said crystalline inorganic film has a long range order.

6. The method of claim 1, wherein said amorphous film on said crystalline inorganic film is n-type doped.

7. The method of claim 1, wherein said amorphous film on said crystalline inorganic film has a thickness of less than 50 nm.

8. The method of claim 1, wherein said crystalline inorganic semiconductor film is silicon.

9. The method of claim 1, wherein said crystalline inorganic semiconductor film is germanium.

10. The method of claim 1, wherein said amorphous film on said inorganic semiconductor crystalline film is protocrystalline or nanocrystalline.

11. The method of claim 1, wherein said inorganic crystalline film is [111] oriented aligning with the buffer layer.

12. The method of claim 1, wherein said inorganic crystalline film has a Raman crystallinity of greater than 90%.

13. The method of claim 1, wherein there is only one doped amorphous semiconductor film layer.

* * * * *